United States Patent [19]
Britton et al.

[11] Patent Number: 5,381,058
[45] Date of Patent: Jan. 10, 1995

[54] FPGA HAVING PFU WITH PROGRAMMABLE OUTPUT DRIVER INPUTS

[75] Inventors: Barry K. Britton, Schnecksville, Pa.; Dwight D. Hill, San Carlos, Calif.

[73] Assignee: AT&T Corp., Morray Hill, N.J.

[21] Appl. No.: 65,823

[22] Filed: May 21, 1993

[51] Int. Cl.6 .......................................... H03K 19/177
[52] U.S. Cl. ........................................ 326/41; 326/39
[58] Field of Search ................. 307/465.1, 465-469

[56] References Cited

U.S. PATENT DOCUMENTS

| | | | |
|---|---|---|---|
| 4,706,216 | 11/1987 | Carter | 307/465 X |
| 4,758,746 | 7/1988 | Birkner et al. | 307/465 |
| 4,786,904 | 11/1988 | Graham, III et al. | 307/465 |
| 5,122,685 | 6/1992 | Chan et al. | 307/465.1 |
| 5,155,389 | 10/1992 | Furtek | 307/465.1 X |
| 5,231,588 | 7/1993 | Agrawal et al. | 307/465 X |

OTHER PUBLICATIONS

Xilinx, The XC4000 Data Book, Beta Technology Sales, Inc., 1009 Hawthorn Drive, Itasca, IL 60143, p. 15.

D. D. Hill et al., AT&T Bell Laboratories, A New Architecture for High-Performance FPGAs, Paper handed out at the Second International Workshop on "Field Programmable Logic and Applications," Vienna, Austria, Aug. 31, 1992, pp. 1-6.

*Primary Examiner*—David R. Hudspeth
*Attorney, Agent, or Firm*—David L. Smith

[57] ABSTRACT

In accordance with the present invention, a field programmable gate array includes at least one programmable function unit. The programmable function unit has first and second logic circuits, each providing an output, and first and second output drivers, each having an input. The input of each output driver is adapted to be selectively coupled to the output of either of the logic circuits. A programmable interconnection is provided to selectively couple the input of the two output drivers to the output of a selective one of the logic circuits.

29 Claims, 3 Drawing Sheets

5,381,058

FPGA HAVING PFU WITH PROGRAMMABLE OUTPUT DRIVER INPUTS

TECHNICAL FIELD

This invention relates generally to an integrated circuit known as a field programmable gate array (FPGA) and particularly to FPGAs having programmable function units (PFUs) with output driver inputs that can be selectively coupled to logic circuit outputs.

BACKGROUND OF THE INVENTION

Integrated circuits (ICs) have traditionally implemented a single function, or plural functions, defined by software programming. In such integrated circuits, the logic architecture that implemented the functionality was fixed during the design of the IC. Recently, integrated circuits have been developed where the logic function can be changed after manufacture. For example, FPGAs have been developed with logic functions that can be configured by the user. They are comprised, at least in part, of a matrix of programmable logic cells. Each programmable logic cell includes routing conductors to receive input signals from outside the cell and to conduct signals to the periphery of the cell for interconnection to other cells. The routing conductors include programmable interconnects for selectively interconnecting routing conductors in the same cell, or for selectively interconnecting routing conductors from one cell to routing conductors of another cell.

In addition to the routing conductors and programmable interconnects, each cell includes a PFU. A PFU is also known as a configurable logic block (CLB) or configurable logic element (CLE) as, for example, in U.S. Pat. No. 4,870,302. A PFU is a repetitive subunit within a FPGA. The PFU receives inputs such as logic level signals and a clock signal on interconnecting routing conductors, operates on the input signals in a predetermined manner dependent on how the PFU is user-configured, and provides selected output signals. The PFU output signals are provided by output drivers.

Each PFU may include more than one type of circuitry capable of logic functions. Typical circuitry included in PFUs includes combinatorial logic circuits and sequential logic circuits. The combinatorial logic circuits generally provide the basic building blocks for combinatorial logic such as AND and OR functions. The sequential logic circuit functions are generally provided by registers. The registers can be configured as flip-flops or latches.

Each PFU typically includes circuitry to perform both types of logic functions, sequential and combinatorial, with a fixed number of each type. The output from the sequential or combinatorial logic circuits has typically been provided to the routing conductors, sometimes referred to as a resistor-capacitor routing resource tree, through PFU output drivers. Each driver has been coupled to the output of one or a subset of the sequential or combinatorial logic circuits.

Some prior an FPGAs have coupled each sequential or combinatorial logic circuit output to a dedicated PFU output driver. With dedicated PFU output drivers, a large number of output drivers have been provided to assure that each logic circuit output was available as an output of the PFU. However, not all logic circuit outputs are used in all PFUs. Since each output driver increases the physical area required to manufacture a FPGA, this is not an efficient technique to provide PFU outputs. Furthermore, the PFU driver output in a dedicated PFU application cannot be used to provide sequential or combinatorial logic circuit outputs other than the logic circuit output to which the driver is dedicated.

Other prior an FPGAs have provided a plurality of multiplexers each coupled between the output of a subset of the PFU sequential or combinatorial logic circuits and a PFU output driver. The multiplexer is user configured to select one of the sequential or combinatorial logic circuit outputs to couple to the PFU driver. The selected sequential or combinatorial logic circuit output is provided as an output of the PFU. This technique has the shortcoming that only one of the sequential or combinatorial logic function circuit outputs of the subset is available as an output from the PFU at any one time. Also, since a multiplexer serves a subset of the PFU sequential or combinatorial logic circuits, multiple PFU drivers cannot be coupled to the same sequential or combinatorial logic circuit to provide multiple, identical outputs from the PFU.

Both of the above-mentioned prior an FPGAs have the further shortcoming that the output from a sequential or combinatorial logic circuit is predetermined to be a specific one of the outputs from the PFU. This has two adverse consequences. Firstly, each PFU output driver generally has different connectivity to the FPGA routing resources. Therefore, it may be less efficient to route a particular sequential or combinatorial logic circuit output signal to its destination outside the originating PFU from one output driver rather than from another output driver. Secondly, since each sequential or combinatorial logic circuit output signal can be driven onto only one PFU output driver, the output driver must source current to drive the entire resistor-capacitor routing resource tree for that output signal. This latter shortcoming was addressed in prior art FPGAs by placing a buffer outside the PFU, in series with the output driver within the PFU, to isolate and drive pan of the resistor-capacitor routing resource tree. However, the buffer would introduce a delay in the PFU output signal that would degrade the FPGA performance.

What is desirable is a FPGA having a versatile PFU including PFU drivers with inputs that can be selectively or programmably coupled to the sequential or combinatorial logic circuit outputs. Such a PFU would provide for efficient connectivity to the FPGA routing resources. Such a PFU would also achieve greater flexibility in structuring the resistor-capacitor routing resource tree without degrading the speed of the FPGA when the output of a sequential or combinatorial logic circuit is expanded. Furthermore, such a FPGA would permit the user during configuration of the FPGA to select the outputs of the PFU from all of the sequential or combinatorial logic function circuit outputs. The outputs of the PFU could be provided utilizing fewer output drivers than sequential or combinatorial logic circuits.

SUMMARY OF THE INVENTION

A field programmable gate array includes at least one programmable function unit. The programmable function unit has first and second logic circuits, each providing an output, and first and second output drivers, each having an input. The input of each output driver is adapted to be selectively coupled to the output of either of the logic circuits. A programmable interconnection is provided to selectively couple the input of the two output drivers to the output of a selective one of the logic circuits.

DETAILED DESCRIPTION

Figure 1:
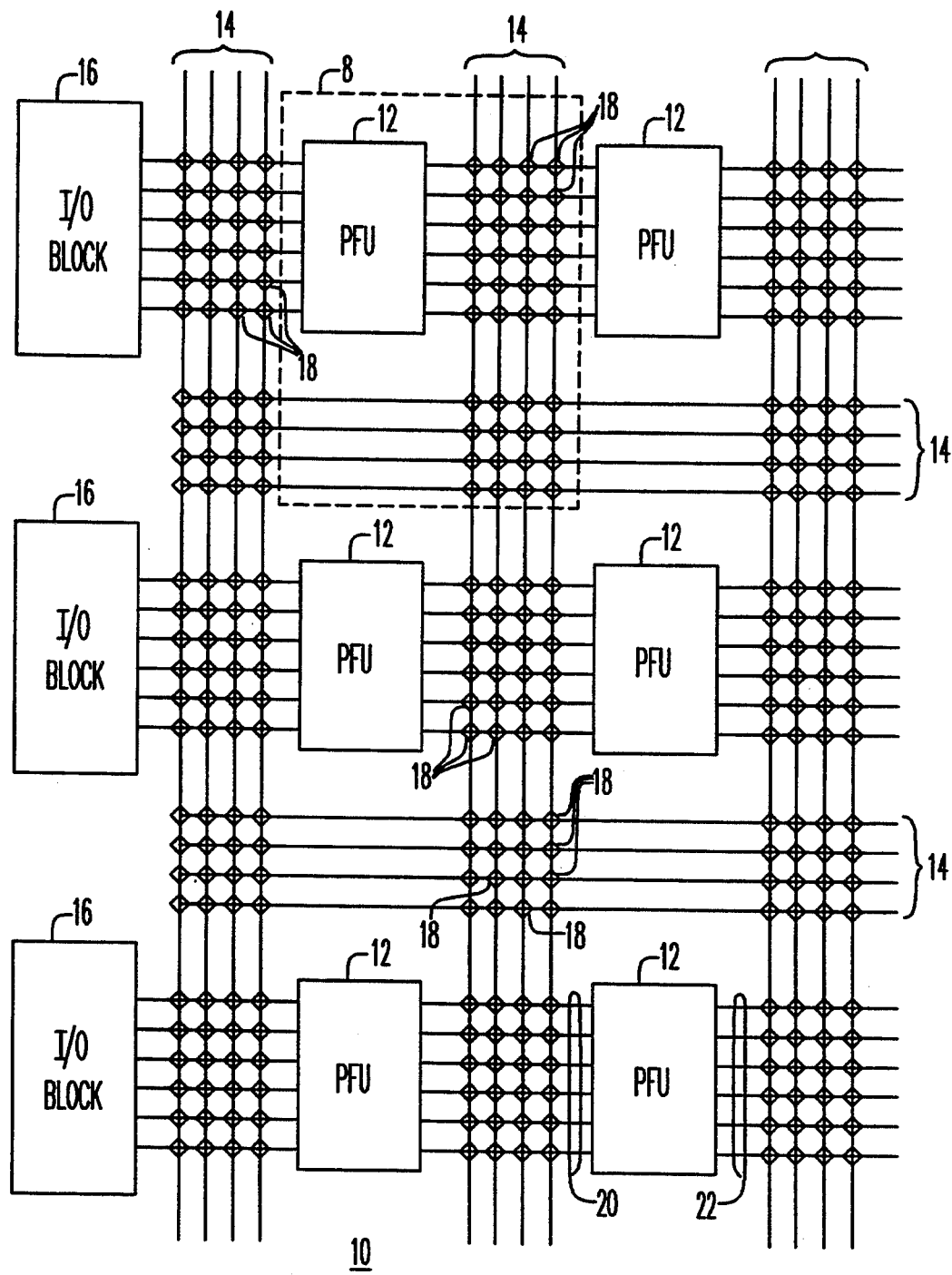
FIG. 1 is a simplified schematic diagram showing a portion of a field programmable gate array.

A portion of an integrated circuit including a field programmable gate array (FPGA) 10 is shown schematically in FIG. 1. The FPGA is comprised of a matrix of programmable logic cells (PLCs). Each PLC includes a program function unit (PFU) for performing logic function, and routing resources for interconnection.

FPGA 10 is a matrix of substantially identical programmable logic cells 8. Along the periphery of FPGA 10 are input/output blocks 16. Each programmable logic cell includes a PFU 12 and routing resources comprising routing conductors 14 and configurable interconnect points (CIPs) 18. The PFU performs logic functions while the routing resources interconnect PFUs to one another as well as connect PFUs to input/output blocks 16.

Routing conductors 14 may be selectively coupled at their intersection through configurable interconnect points 18. CIPs typically use a matrix of pass transistors, that can be turned on or off by the user, to interconnect various combinations of routing resource conductors. A pass transistor has a source electrode connected to a first routing-resource conductor, such as a vertical conductor, and a drain electrode connected to a second routing resource conductor that is to be interconnected with the first routing resource conductor, such as another vertical conductor or a horizontal conductor. Conduction through the pass transistor is controlled by the voltage applied to the gate. The interconnected routing resource conductors are referred to as a resistor-capacitor routing resource tree.

A PFU 12 is a user configurable, repetitive subunit within a FPGA that receives input signals, such as logic level signals and a clock signal, on input lines 20. PFU 12 operates on the input signals in a user-configured manner and provides selected output signals on output lines 22. The input and output lines may be selectively connected to the routing conductors 14 by CIPs 18.

By using CIPs to selectively couple input/output blocks, routing conductors, input lines, and output lines, signals brought into the FPGA or generated in a PFU can be routed to any PFU for further processing, or to an input/output block to be taken off chip.

Figure 2:
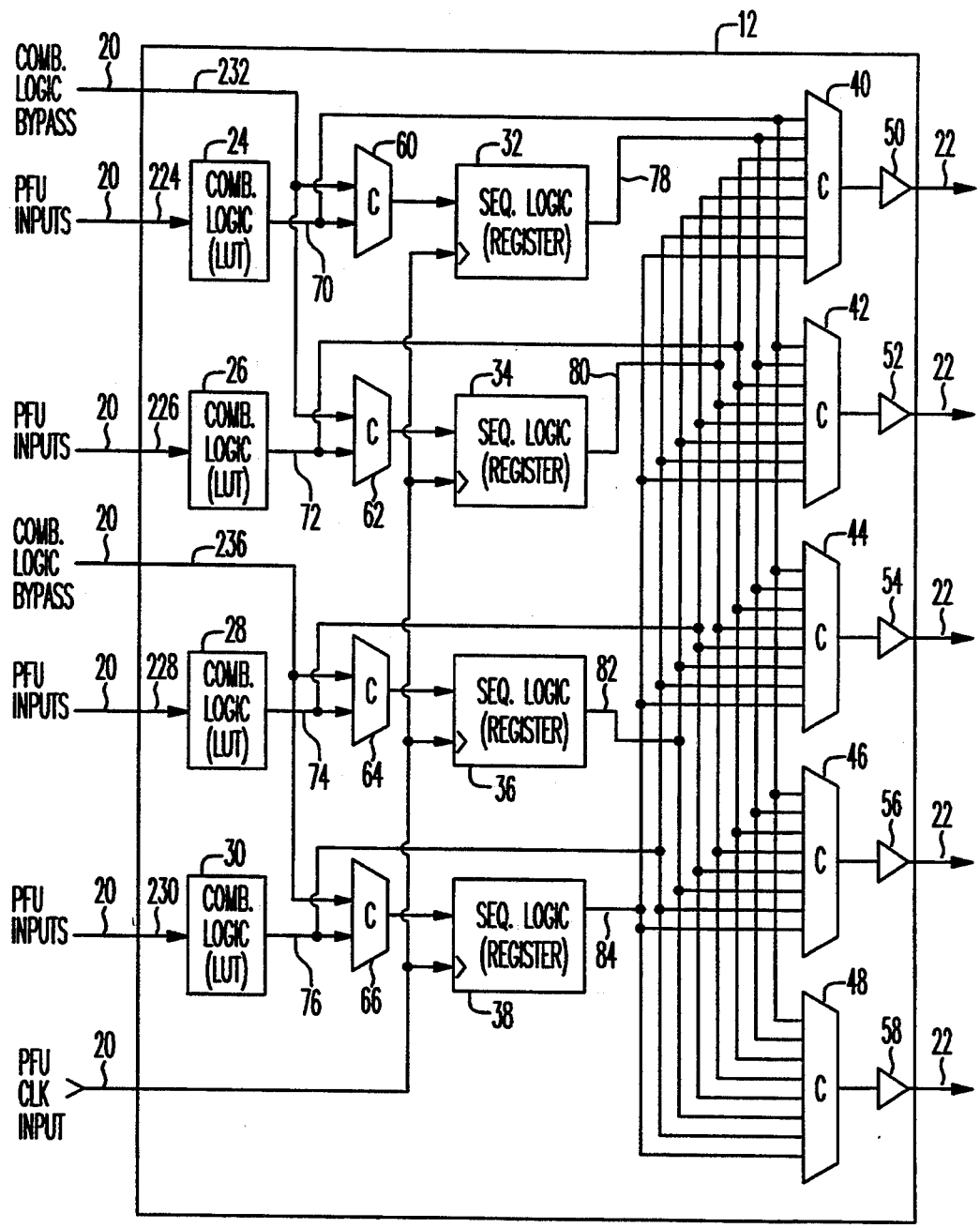
FIG. 2 is a schematic diagram showing a programmable function unit of an illustrated embodiment of the present invention.

An illustrative embodiment of a PFU 12, shown in greater detail in FIG. 2, includes combinatorial logic circuits 24, 26, 28 and 30, sequential logic circuits 32, 34, 36 and 38, output multiplexers 40, 42, 44, 46 and 48, output drivers 50, 52, 54, 56 and 58, and intermediate multiplexers 60, 62, 64 and 66. The output from each logic circuit is available as an input to each output multiplexer. The input of each output driver can be ,selectively coupled to the output of any of the logic circuits. PFU 12 includes a plurality of logic circuits 24, 26, 28, 30, 32, 34, 36, and 38 that receive the PFU input signals on representative input lines 20. The output of each logic circuit 24, 26, 28, 30, 32, 34, 36 and 38 is available as an input to each of output multiplexers 40, 42, 44, 46, and 48. Each output multiplexer is responsive to select inputs (not shown) to selectively pass one of the signals appearing at the input to its output. The output of each output multiplexer 40, 42, 44, 46 and 48 provides the input to an associated output driver 50, 52, 54, 56, and 58. The output from the output drivers provide the outputs from PFU 12 on output lines 22. PFU 12 is user configurable as to (1) the function performed by logic circuits 24, 26, 28, 30, 32, 34, 36 and 38, (2) the circuits used, (3) the selection of inputs to the sequential logic circuits, and (4) the outputs from the logic circuits selected by multiplexers 40, 42, 44, 46 and 48, respectively, as outputs from the PFU.

Logic circuits 24, 26, 28, 30, 32, 34, 36 and 38 are illustratively of two types. For example, logic circuits 24, 26, 28 and 30 are combinatorial logic circuits, and logic circuits 32, 34, 36 and 38 are sequential logic circuits. The combinatorial logic circuits 24, 26, 28, and 30 provide basic building blocks for combinatorial logic such as AND and OR functions. The combinatorial logic may take the form of look-up tables. The sequential logic circuits 32, 34, 36, and 38 provide sequential logic circuit functions that are generally implemented by registers. The registers may be flip-flops or latches or may be configured as flip-flops or latches, for example.

The PFU input signal on input line 224 (228) is received by combinatorial logic circuit 24 (28). Similarly, the PFU input signal on input line 226 (230) is received by combinatorial logic circuit 26 (30). Intermediate multiplexer 60 (62) selects its output and hence the input to sequential logic circuit 32 (34) from either the input signal on input line 232 or the output 70 (72) of logic circuit 24 (26). Similarly, intermediate multiplexer 64 (66) selects its output and hence the input to sequential logic circuit 36 (38) from either the input signal on input line 236 or the output 74 (76) of logic circuit 28 (30). Each of the outputs 70, 72, 74, and 76 of logic circuits 24, 26, 28, and 30, as well as each of the outputs 78, 80, 82, and 84 of logic circuits 32, 34, 36, and 38 are provided as inputs to each output multiplexer 40, 42, 44, 46, and 48. Each of the logic circuit outputs is thus adapted to be selectively coupled as the input to a respective output driver 50, 52, 54, 56, and 58. The outputs from the output drivers provide the outputs from PFU 12. In this manner, each multiplexer can selectively couple the output of any of the logic circuits as the input to its associated output driver. This makes a logic circuit output available as the output driver output for any of the output drivers, in any combination. Typically only one multiplexer output would be provided as an input to an output driver at any time. Such flexibility can, in providing a specific logic circuit output at a specific one or more output driver outputs, contribute to efficient allocation of routing resources by reducing routing complexity.

Figure 3:
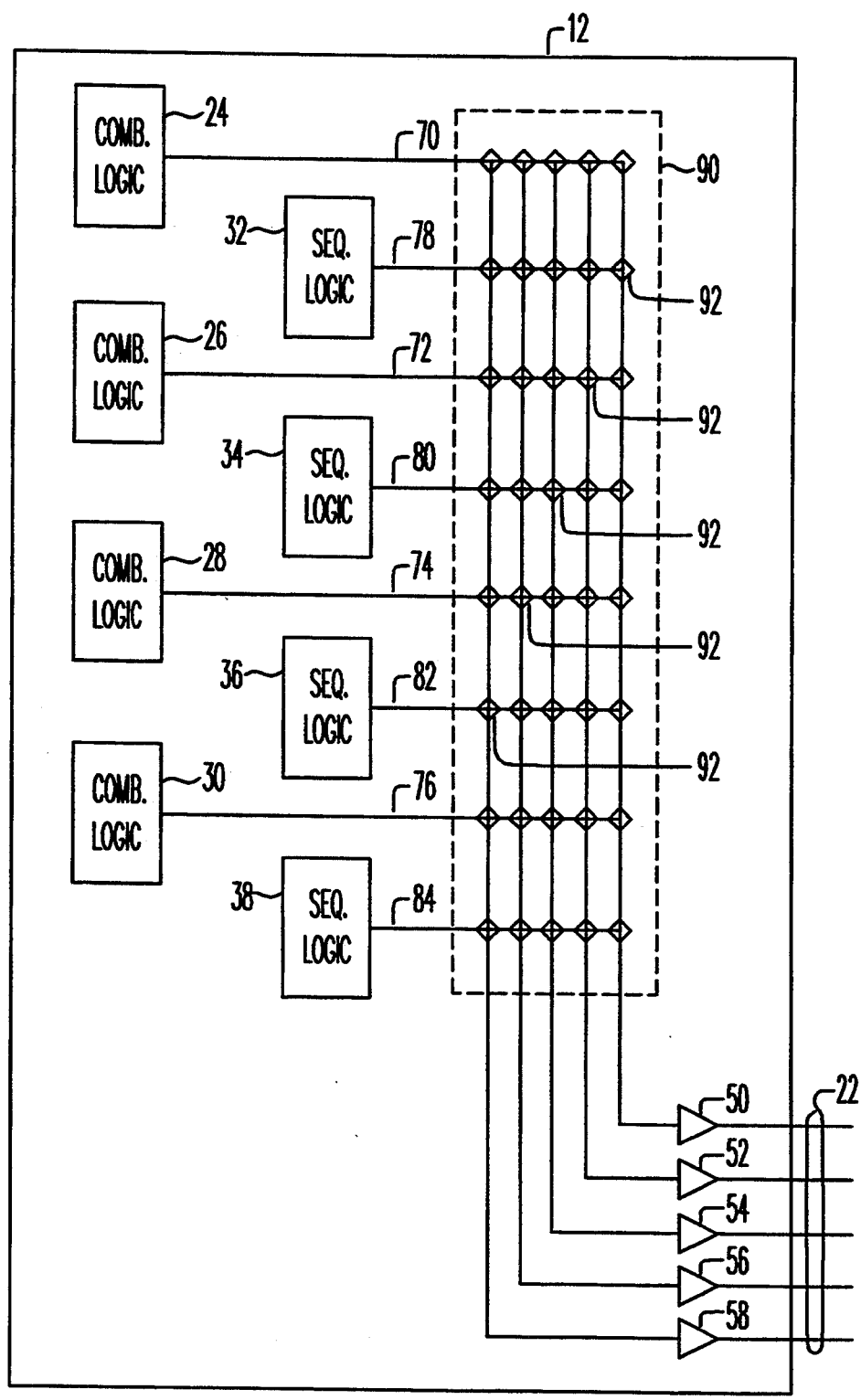
FIG. 3 is a circuit diagram showing a simplified programmable function unit including an illustrative embodiment of a programmable interconnection.

FIG. 3 shows a PFU 12 simplified for clarity, including an illustrative embodiment of a programmable interconnection 90 comprised of CIPs 92 to selectively couple the outputs of the logic circuits 24, 26, 28, 30, 32, 34, 36 and 38 to inputs of the output drivers 50, 52, 54, 56 and 58. Each of the outputs from the logic circuits is adapted to be selectively coupled by programmable interconnection 90 as the input to any of the output drivers 50, 52, 54, 56 and 58. Each of the outputs 70, 72, 74, 76, 78, 80, 82 and 84 is adapted to be selectively coupled to each input of the output drivers 50, 52, 54, 56 and 58 through a CIP 92. CIPs 92 function like CIPs 18 and may be similar or different in structure. The user may configure PFU 12 to provide any logic circuit output as the input to any output driver. It follows that the user can provide any logic circuit output as the input to a selected output driver, and thus determine where a logic circuit output is provided as an output from the PFU. Furthermore, the user can selectively couple a single logic circuit output to more than one PFU output driver input. Coupling a logic circuit output to more than one PFU output driver input also permits an otherwise relatively large resistor-capacitor routing resource tree to be divided into multiple, smaller resource trees. Whereas a relatively large muting resource tree would be driven by a single PFU output driver, and may require a buffer outside the PFU to assist in driving the relatively large routing resource tree, each of the multiple, smaller routing resource trees would be driven by a PFU output driver internal to the PFU. The smaller routing resource trees, coupled with obviating the need for a buffer outside the PFU, enhances the speed of the FPGA.

While the illustrative embodiment has shown a PFU with eight logic circuits and five output drivers, the invention is not limited thereto. The invention has application to a PFU with various numbers of logic circuits and output drivers. The invention has been described as being implemented using configurable interconnection points. One skilled in the an could implement CIPs using such devices as fuses, antifuses, fusible links, EPROMs, or pass transistors with RAM cells.

We claim:

1. A field programmable gate array, comprising:
   at least one programmable function unit, each of said at least one programmable function unit having a plurality of logic circuits and a plurality of output drivers, each of said plurality of logic circuits having an output, each of said plurality of output drivers having an input adapted to be selectively coupled to any of the outputs of the plurality of logic circuits, one of said plurality of logic circuits comprising a sequential logic circuit; and
   a programmable interconnection adapted to selectively couple the input of each of the plurality of output drivers to the output of a selected one of the plurality of logic circuits, whereby any of the logic circuit outputs may be coupled as an input to any one of the output drivers.

2. A field programmable gate array as recited in claim 1, wherein the sequential logic circuit is a latch.

3. A field programmable gate array as recited in claim 1, wherein the sequential logic circuit is configurable as a latch.

4. A field programmable gate array as recited in claim 1, wherein the sequential logic circuit is a flip-flop.

5. A field programmable gate array as recited in claim 1, wherein the sequential logic circuit is configurable as a flip-flop.

6. A field programmable gate array as recited in claim 1, wherein each output driver further comprises an output, each output driver output providing an output from the programmable function unit.

7. A field programmable gate array as recited in claim 1, wherein the plurality of logic circuits is different in number than the plurality of output drivers.

8. A field programmable gate array as recited in claim 7, wherein the number of output drivers is less than the number of logic circuits.

9. A field programmable gate array as recited in claim 1, wherein one of said plurality of logic circuit comprises a combinatorial logic circuit.

10. A field programmable gate array as recited in claim 9, wherein the combinatorial logic circuit is a look-up table.

11. A field programmable gate array, comprising:
    at least one programmable function unit, each of said at least one programmable function unit having a plurality of logic circuits and a plurality of output drivers, each of said plurality of logic circuits having an output, each of said plurality of output drivers having an input adapted to be selectively coupled to any of the outputs of the plurality of logic circuits; and
    a multiplexer adapted to selectively couple the input of each of the plurality of output drivers to the output of a selected one of the plurality of logic circuits, whereby any of the logic circuit outputs may be coupled as an input to any one of the output drivers.

12. A field programmable gate array as recited in claim 11, wherein each output driver further comprises an output, each output driver output providing an output from the programmable function unit.

13. A field programmable gate array as recited in claim 11, wherein the plurality of logic circuits is different in number than the plurality of output drivers.

14. A field programmable gate array as recited in claim 13, wherein the number of output drivers is less than the number of logic circuits.

15. A field programmable gate array as recited in claim 11, wherein one of said plurality of logic circuits comprises a combinatorial logic circuit.

16. A field programmable gate array as recited in claim 15, wherein the combinatorial logic circuit is a look-up table.

17. A field programmable gate array, comprising:
    at least one programmable function unit, each of said at least one programmable function unit comprising a first logic circuit providing a first logic circuit output, a second logic circuit providing a second logic circuit output, a first output driver having an input, and a second output driver having an input; and
    a programmable interconnection adapted to selectively couple the input of the first output driver and the input of the second output drive to the output of at least one of the first and second logic circuits, at least one of said logic circuits comprising a sequential logic circuit.

18. A field programmable gate array as recited in claim 17, wherein the sequential logic circuit is a latch.

19. A field programmable gate array as recited in claim 17, wherein the sequential logic circuit is configurable as a latch.

20. A field programmable gate array as recited in claim 17, wherein the sequential logic circuit is a flip-flop.

21. A field programmable gate array as recited in claim 17, wherein the sequential logic circuit is configurable as a flip-flop.

22. A field programmable gate array as recited in claim 17, wherein one of said logic circuits comprises a combinatorial logic circuit.

23. A field programmable gate array as recited in claim 22, wherein the combinatorial logic circuit is a look-up table.

24. A field programmable gate array as recited in claim 17, wherein the first output driver further comprises an output, and wherein the second output driver further comprises an output, the outputs from the first and second output drivers providing outputs from the programmable function unit.

25. A field programmable gate array, comprising:
at least one programmable function unit, each of said at least one programmable function unit comprising a first logic circuit providing a first logic circuit output, a second logic circuit providing a second logic circuit output, a first output driver having input, and a second output driver having an input; and
a multiplexer adapted to selectively couple the input of the first output driver and the input of the second output driver to the output of at least one of the first and second logic circuits.

26. A field programmable gate array as recited in claim 25, wherein the programmable interconnection further comprises configurable interconnect points to achieve the selective coupling.

27. A field programmable gate array as recited in claim 25, wherein one of said logic circuits comprises a combinatorial logic circuit.

28. A field programmable gate array as recited in claim 27, wherein the combinatorial logic circuit is a look-up table.

29. A field programmable gate array as recited in claim 25, wherein the first output driver further comprises an output, and wherein the second output driver further comprises an output, the outputs from the first and second output drivers providing outputs from the programmable function unit.

* * * * *